United States Patent
Chan et al.

(10) Patent No.: US 9,619,379 B1
(45) Date of Patent: Apr. 11, 2017

(54) DATA STORAGE DEVICE INCREASING SEQUENCE DETECTOR CLOCK FREQUENCY WHEN BOTTLENECK CONDITION IS DETECTED

(71) Applicant: Western Digital Technologies, Inc., Irvine, CA (US)

(72) Inventors: Tom Sai-Cheung Chan, San Marino, CA (US); Wenli Zhu, Irvine, CA (US); Jaedeog Cho, Irvine, CA (US); Thao Hieu Banh, Lake Forest, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 684 days.

(21) Appl. No.: 13/787,743

(22) Filed: Mar. 6, 2013

(51) Int. Cl.
  *G06F 12/02* (2006.01)
  *H03M 13/29* (2006.01)
  *G06F 13/16* (2006.01)

(52) U.S. Cl.
  CPC ...... *G06F 12/0246* (2013.01); *G06F 13/1673* (2013.01); *H03M 13/2975* (2013.01); *H03M 13/2948* (2013.01)

(58) Field of Classification Search
  CPC ............ G06F 12/0246; G06F 13/1673; H03M 13/2975; H03M 13/2948
  See application file for complete search history.

(56) References Cited

U.S. PATENT DOCUMENTS

| | | | |
|---|---|---|---|
| 5,844,920 A | 12/1998 | Zook et al. | |
| 6,009,549 A | 12/1999 | Bliss et al. | |
| 7,136,244 B1 | 11/2006 | Rothberg | |
| 7,266,750 B1 | 9/2007 | Patapoutian et al. | |
| 7,577,891 B2* | 8/2009 | Farjadrad et al. | 714/752 |
| 7,577,892 B1* | 8/2009 | He | 714/755 |
| 7,596,196 B1 | 9/2009 | Liu et al. | |
| 7,793,201 B1 | 9/2010 | Ulriksson | |
| 7,805,642 B1* | 9/2010 | Farjadrad | 714/708 |
| 7,843,660 B1 | 11/2010 | Yeo | |
| 7,853,855 B1* | 12/2010 | He | 714/755 |
| 8,234,536 B1* | 7/2012 | Farjadrad et al. | 714/752 |
| 2007/0011573 A1* | 1/2007 | Farjadrad et al. | 714/760 |
| 2011/0185264 A1 | 7/2011 | Zeng et al. | |

FOREIGN PATENT DOCUMENTS

WO  WO2011093846 A1  4/2011

* cited by examiner

Primary Examiner — Arpan P. Savla

(57) ABSTRACT

A data storage device is disclosed comprising a non-volatile memory (NVM). During a read operation, a sequence of signal samples is generated representing codewords stored in the NVM. The signal samples are buffered to generate buffered signal samples. The buffered signal samples are processed at a first frequency to detect a data sequence, and a bottleneck condition is detected associated with processing the buffered signal samples at the first frequency. When the bottleneck condition is detected, the buffered signal samples are processed at a second frequency higher than the first frequency to detect the data sequence.

22 Claims, 8 Drawing Sheets

DATA STORAGE DEVICE INCREASING SEQUENCE DETECTOR CLOCK FREQUENCY WHEN BOTTLENECK CONDITION IS DETECTED

BACKGROUND

Data storage devices, such as disk drives, solid state drives and hybrid drives are employed in numerous areas such as computer systems (e.g., desktops, laptops, portables, etc.) and consumer devices (e.g., music players, cell phones, cameras, etc.). User data is typically stored in a non-volatile memory (NVM), such as a magnetic disk or a non-volatile semiconductor memory (e.g., Flash memory). Since the NVM is a noisy channel, the user data is typically encoded into codewords using any suitable coding technique which may include an iterative code (e.g., a Low Density Parity Check Code (LDPC)). The recorded codewords are read from the NVM and decoded so as to correct errors in the user data due to noise in the recording/reproduction process.

DETAILED DESCRIPTION

Figure 1:
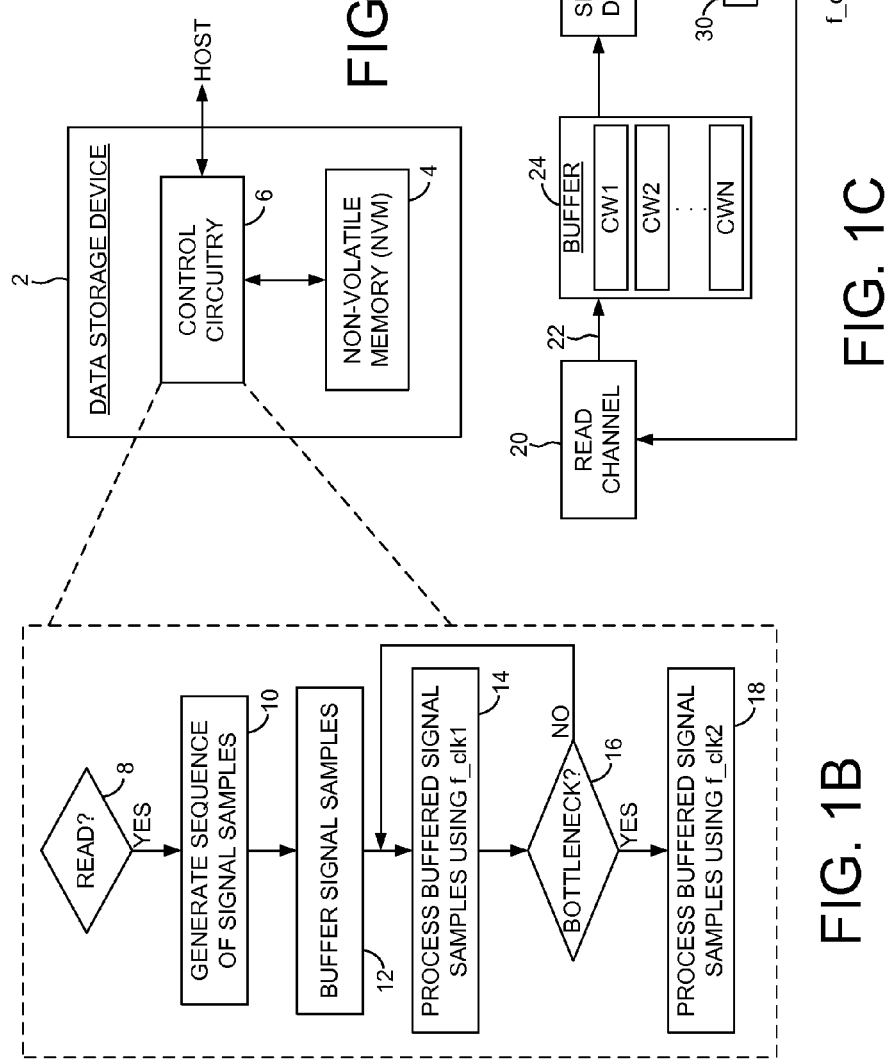
FIG. 1A shows a data storage device comprising a non-volatile memory (NVM) according to an embodiment.
FIG. 1B is a flow diagram according to an embodiment where signal samples are buffered at a first frequency, and when a bottleneck condition is detected, the buffered signal samples are processed at a second, higher frequency to detect a data sequence.
FIG. 1C shows an embodiment where a read channel generates the signal samples that are buffered in a buffer, and a sequence detector processes the buffered signal samples to detect the data sequence.

FIG. 1A shows a data storage device 2 according to an embodiment comprising a non-volatile memory (NVM) 4, and control circuitry 6 operable to execute the flow diagram of FIG. 1B wherein during a read operation (block 8), a sequence of signal samples is generated representing codewords stored in the NVM (block 10). The signal samples are buffered to generate buffered signal samples (block 12). The buffered signal samples are processed at a first frequency to detect a data sequence (block 14), and a bottleneck condition is detected associated with processing the buffered signal samples at the first frequency (block 16). When the bottleneck condition is detected, the buffered signal samples are processed at a second frequency higher than the first frequency to detect the data sequence (block 18).

FIG. 1C shows control circuitry 6 of the data storage device 2 comprising a suitable read channel 20 operable to generate the signal samples 22 during a read operation. The signal samples 22 are buffered in a buffer 24 capable of storing the signal samples of multiple codewords (CW1-CWN). The signal samples of a current codeword are transferred from the buffer 24 to a suitable sequence detector 26 operable to process the signal samples to detect a data sequence 28. In one embodiment, a first clock f_clk1 clocks the read channel 20 in order to buffer the signal samples 22 in the buffer 24 at a first frequency. A multiplexer 30 initially selects the first clock f_clk1 as the clock f_clk used to transfer the buffered signal samples to the sequence detector 26 and clock the sequence detector 26 at the first frequency. When the bottleneck condition is detected, the multiplexer 30 selects a second clock f_clk2 as the clock f_clk used to transfer the buffered signal samples to the sequence detector 26 and clock the sequence detector 26 at the second, higher frequency in order to alleviate the bottleneck condition.

In one embodiment, processing the buffered signal samples at the first, lower frequency during normal operation (when the bottleneck condition is not occurring) reduces the amount of power consumed by the data storage device. When the bottleneck condition is detected, in one embodiment switching to the second, higher frequency to processes the buffered signal samples to detect the data sequence 28 helps ensure the data storage device maintains a desired throughput during read operations. For example, switching to the second, higher frequency when the bottleneck condition is detected may enable the data storage device to continue streaming the detected data to a host rather than pause the stream until the bottleneck condition passes.

The frequency of the second clock f_clk2 may be higher than the frequency of the first clock f_clk1 by any suitable amount (e.g., 25% higher). In an embodiment described below, the frequency of the first clock f_clk1 may vary based on a data rate of a particular section of the non-volatile memory 4 being accessed, and therefore the difference in frequency between the first clock f_clk1 and the second clock f_clk2 may vary depending on the data rate during a read operation. In yet another embodiment, the control circuitry 6 may vary the frequency of the second clock f_clk2, such as by increasing the frequency of the second clock f_clk2 when the control circuitry 6 encounters an extended bottleneck condition.

Figure 2:
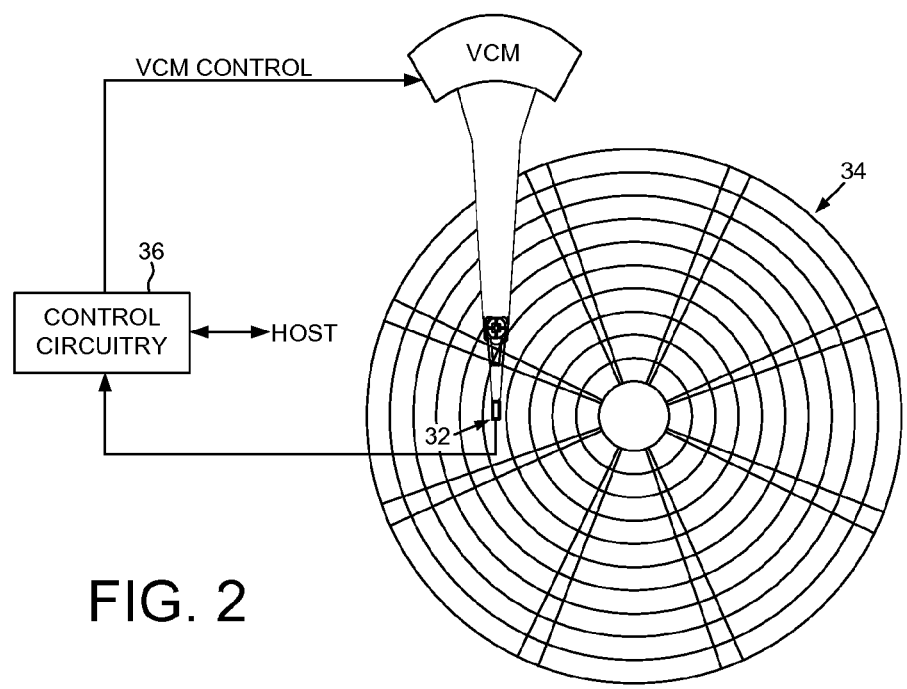
FIG. 2 shows an embodiment where the data storage device comprises a disk drive.
Figure 3:
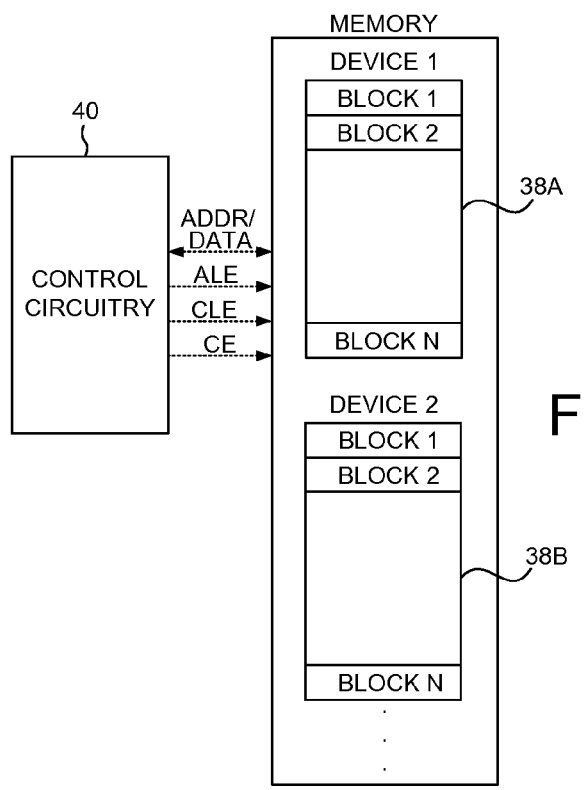
FIG. 3 shows an embodiment where the data storage device comprises a solid state drive.

Any suitable data storage device 2 may be employed in the embodiments, and the data storage device 2 may comprise any suitable non-volatile memory 4. FIG. 2 shows a data storage device comprising a disk drive including a head 32 actuated over a disk 34 and control circuitry 36 for interfacing with a host. FIG. 3 shows a data storage device comprising a solid state drive including a plurality of non-volatile semiconductor memories 38A, 38B, etc., such as flash memories, and control circuitry 40 for interfacing with a host. A hybrid data storage device may also be employed comprising components of a disk drive shown in FIG. 2 combined with the non-volatile semiconductor memories shown in FIG. 3, including the appropriate control circuitry for accessing the non-volatile semiconductor memories.

Figure 4:
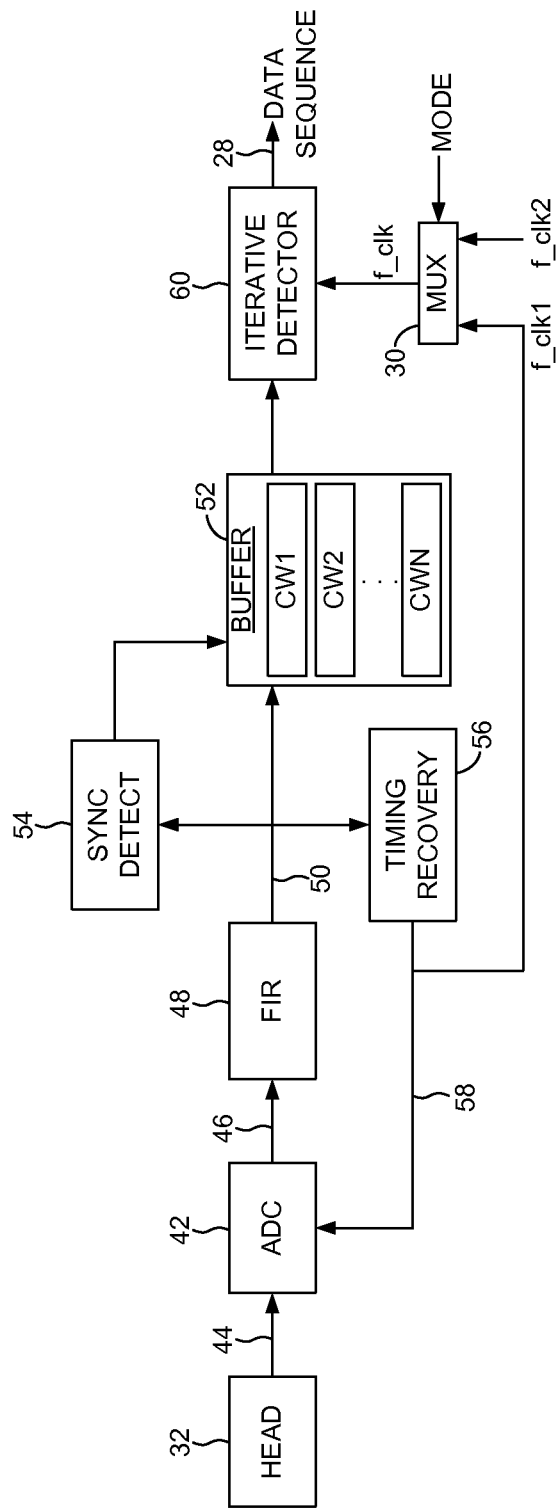
FIG. 4 shows control circuitry of a disk drive according to an embodiment including an analog-to-digital converter for generating the signal samples which are equalized according to a target response.

FIG. 4 shows read channel circuitry within the disk drive of FIG. 2 according to an embodiment comprising an analog-to-digital converter 42 for sampling the read signal 44 emanating from the head 32 to generate base signal samples 46. The base signal samples 46 are equalized using an equalizing filter 48 according to a target response, such as a partial response. The equalized signal samples 50 are buffered in a buffer 52 as a plurality of codewords (CW1-CWN). A sync mark detector 54 detects a sync mark in the equalized signal samples 50 in order to delineate each codeword, and a timing recovery circuit 56 processes the equalized signal samples 50 to generate a sampling clock 58 synchronized to the data rate of the read signal 44. In alternative embodiment, the read signal 44 may be sampled asynchronously and the asynchronous signal samples interpolated to generate the synchronous signal samples. An iterative detector 60 processes the buffered signal samples representing a current codeword in the buffer 52 to detect the data sequence 28.

In one embodiment, the sampling clock 58 in FIG. 4 clocks the front-end circuitry of the read channel, including the analog-to-digital converter 42, the equalizing filter 48, the sync mark detector 54, and the circuitry used to buffer the equalized signal samples 50 in the buffer 52 at the data rate of the read signal 44. In one embodiment, the data rate of the read signal 44 depends on the rate that the data is recorded on the disk 34, which depends on the rotation speed of the disk and the radial location of the head. For example, in one embodiment the recording density may be increased toward the outer diameter of the disk 34 such that the data rate of the read signal 44 increases toward the outer diameter of the disk 34.

During normal operation, the multiplexer 30 selects the sampling clock f_clk1 as the clock f_clk used to transfer the buffered signal samples to a sequence detector as well as clock the sequence detector. That is, during normal operation the sequence detector is clocked at the same frequency (first frequency) as the front-end circuitry of the read channel. In the embodiment of FIG. 4, the sequence detector comprises a suitable iterative detector 60 operating based on a suitable iterative code, such as a Low Density Parity Check Code (LDPC). When the signal samples of a current codeword have been buffered in the buffer 52, the signal samples of the current codeword are processed by the iterative detector 60 while concurrently buffering the signal samples of the next codeword in the buffer 52.

If the sequence detector is able to decode the current codeword before the next codeword is buffered in the buffer 52, then the sequence detector begins processing the next codeword while the signal samples of the following codeword are buffered. However, if the sequence detector takes a longer time to process the current codeword due, for example, to a marginal data sector on the disk, then the signal samples of a number of the following codewords are buffered in the buffer 52 while the sequence detector is processing the current codeword. Eventually the control circuitry will consider the delay in the sequence detector processing as a bottleneck condition, wherein the multiplexer 30 is then configured to output the second, faster clock f_clk2 as the clock f_clk applied to the sequence detector for processing the buffered signal samples. In one embodiment, using the second, faster clock f_clk2 enables the sequence detector to process the buffered signal samples so as to maintain a continuous throughput (i.e., fast enough to prevent the buffer 52 from overflowing). Once the bottleneck condition passes, the multiplexer 30 is configured to output the first, slower clock f_clk1 as the clock f_clk applied to the sequence detector in order to reduce the clocking speed and conserve power.

Figure 5A:
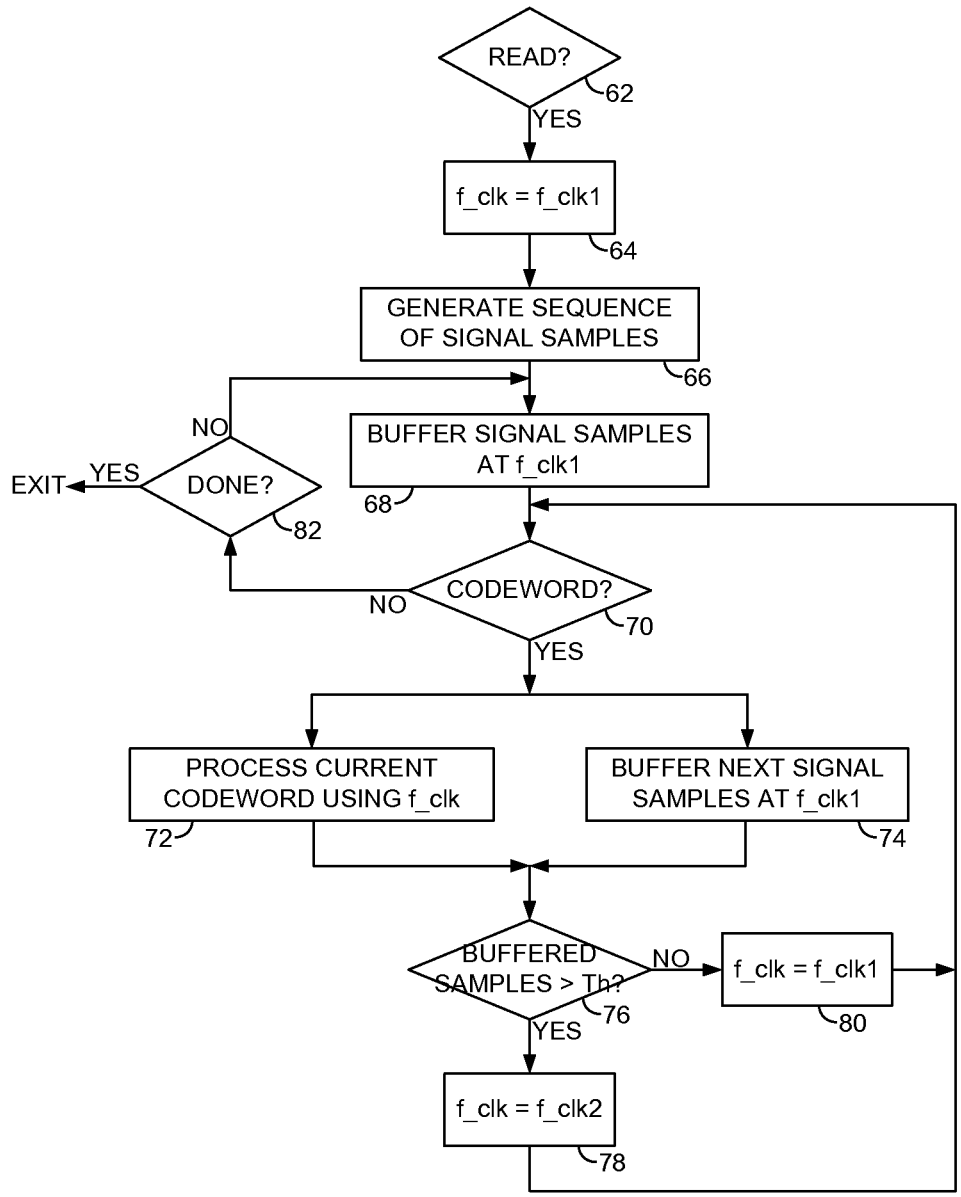
FIG. 5A is a flow diagram according to an embodiment wherein the bottleneck condition is detected when the buffered signal samples exceed a threshold.

The bottleneck condition may be detected in any suitable manner, and the clock f_clk may be switched to the second, faster clock f_clk2 at any suitable time relative to when the bottleneck condition is detected. FIG. 5A is a flow diagram according to an embodiment wherein when a read operation is executed (block 62), the sequence detector clock f_clk is initialized to the first, slower clock f_clk1 (block 64). The sequence of signal samples is generated and buffered at the first frequency of the first, slower clock f_clk1 (block 66), and when the signal samples representing a codeword have been buffered (block 68), the buffered signal samples are processed by the sequence detector (block 72) while concurrently buffering the signal samples for the next codeword (block 74). If after processing the current codeword the number of signal samples stored in the buffer exceeds a threshold (block 76), a bottleneck condition is detected and the sequence detector clock f_clk is changed to the second, faster clock f_clk2 (block 78). If the number of buffered signal samples does not exceed the threshold at block 76, then the sequence detector clock f_clk is reset (if necessary) to the first, slower clock f_clk1 (block 80). The process then repeats from block 70 to check whether the signal samples of a full codeword has been buffered. If there is not a full codeword in the buffer, and the read operation has not completed (block 82), then the processes repeats from block 68.

Figure 5B:
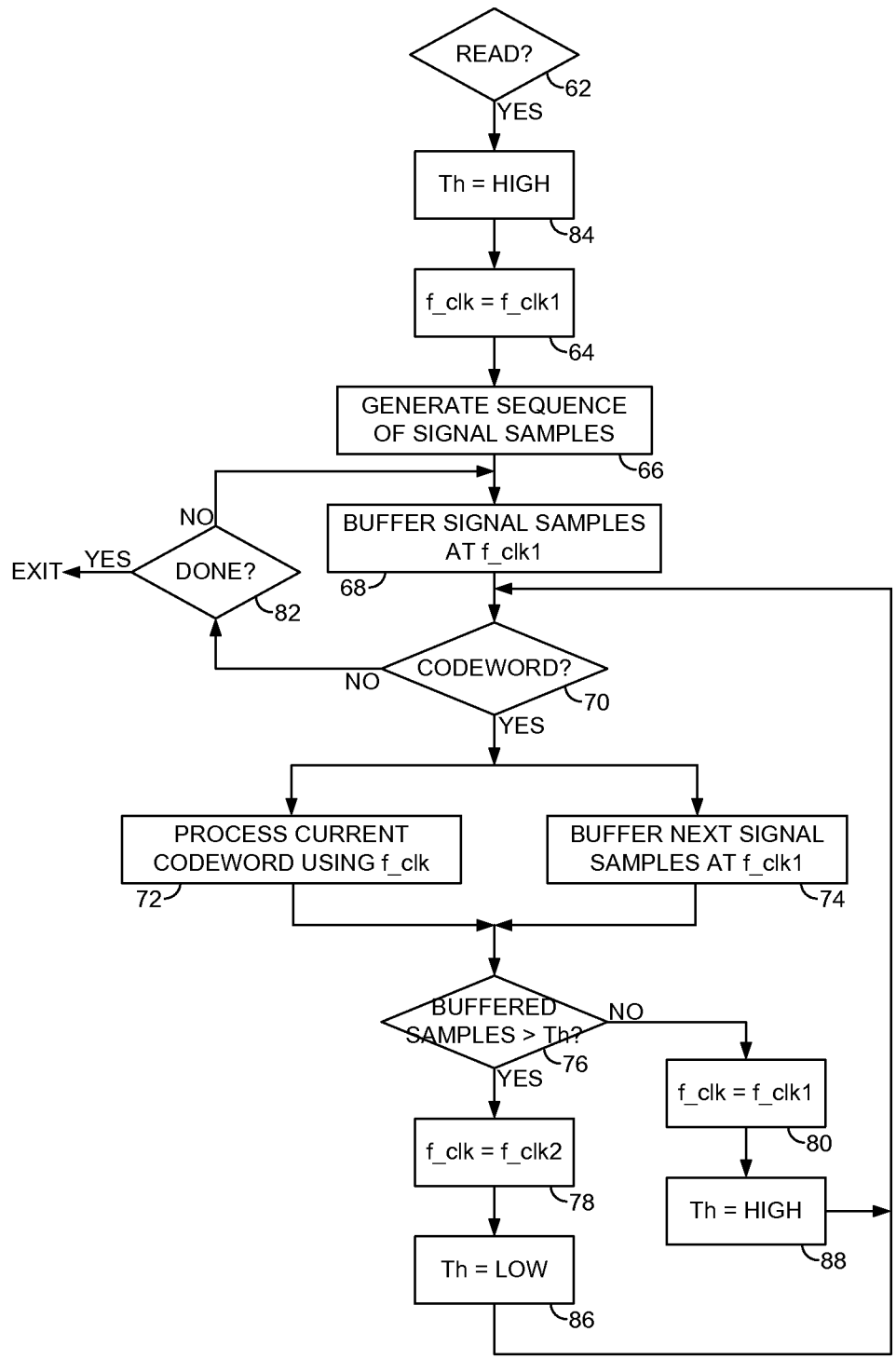
FIG. 5B is a flow diagram according to an embodiment wherein a second threshold is employed to implement hysteresis in detecting the bottleneck condition.

FIG. 5B is a flow diagram according to an embodiment which extends on the embodiment of FIG. 5A by implementing hysteresis in the threshold used to switch between the first, slower clock f_clk1 and the second, faster clock f_clk2. The threshold is initialized to a high value (block 84), and when the sequence detector clock f_clk is switched to the second, faster clock f_clk2 (block 78), the threshold is set to a lower value (block 86) to ensure that a sufficient number of buffered signal samples are processed at the faster clock rate before switching back to the slower clock rate. When the sequence detector clock f_clk is reset back to the slower clock rate (block 80), the threshold is also reset to the higher value (block 88) thereby providing hysteresis in the comparison.

In another embodiment, the bottleneck condition is detected when the number of codewords represented by the buffered signal samples exceeds a threshold. For example, if the buffer 52 has the capacity to store ten codewords, the bottleneck condition may be detected if the number of buffered codewords is more than seven. This embodiment may also employ hysteresis, such as switching back to the first, slower clock f_clk1 when the number of buffered codewords falls below three. In this manner, the likelihood the buffer 52 will overflow during a read operation is reduced which helps ensure the data storage device is able to maintain a continuous stream of data transfer to the host.

Figure 6:
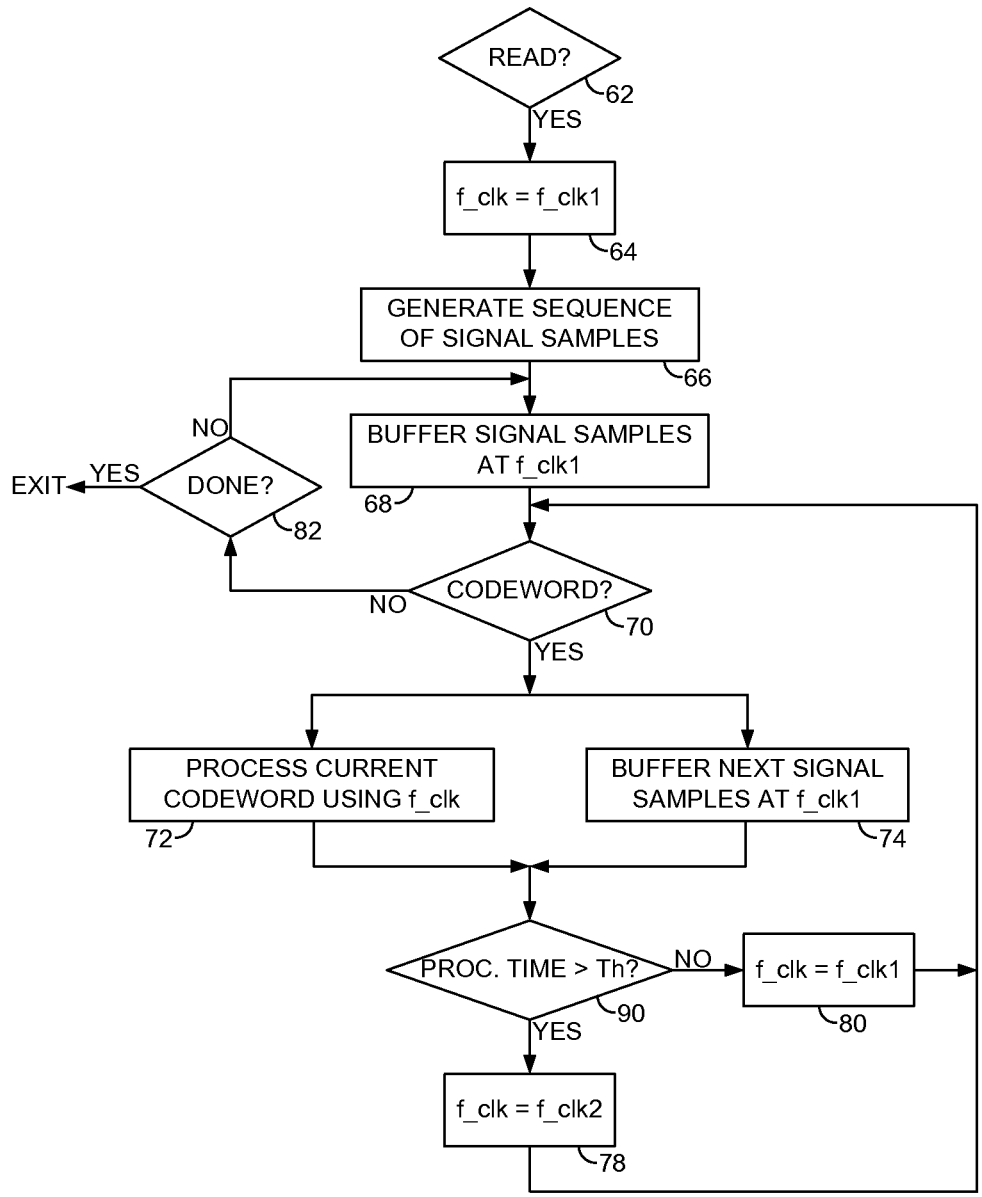
FIG. 6 is a flow diagram according to an embodiment wherein the bottleneck condition is detected when a processing time of a sequence detector exceeds a threshold.

In other embodiments, the bottleneck condition may be detected based on criteria other than, or in addition to, the amount of free space available in the buffer 52. FIG. 6 shows a flow diagram according to an embodiment similar to the flow diagram of FIG. 5A except that the bottleneck condition is detected when a processing time of the sequence detector while processing the current codeword exceeds a threshold (block 90). The processing time may exceed the threshold when the data storage device encounters a marginal storage element of the non-volatile memory, such as a data sector on a disk comprising a media defect that reduces the quality of the read signal rendering the codeword difficult to decode. When the sequence detector encounters a difficult codeword, the processing time may increase for any suitable reason, such as by adjusting the target response of a trellis type sequence detector while iterating on the signal samples, or by adjusting noise prediction filters while iterating on the signal samples, or by adjusting erasure pointers of a suitable error correction code (ECC) while iterating on the signal samples, etc. In another embodiment, the signal samples at the input of the equalizing filter 48 are buffered (rather than the output), and the equalizing filter 48 is adjusted while iterating on the signal samples.

Figure 7A:
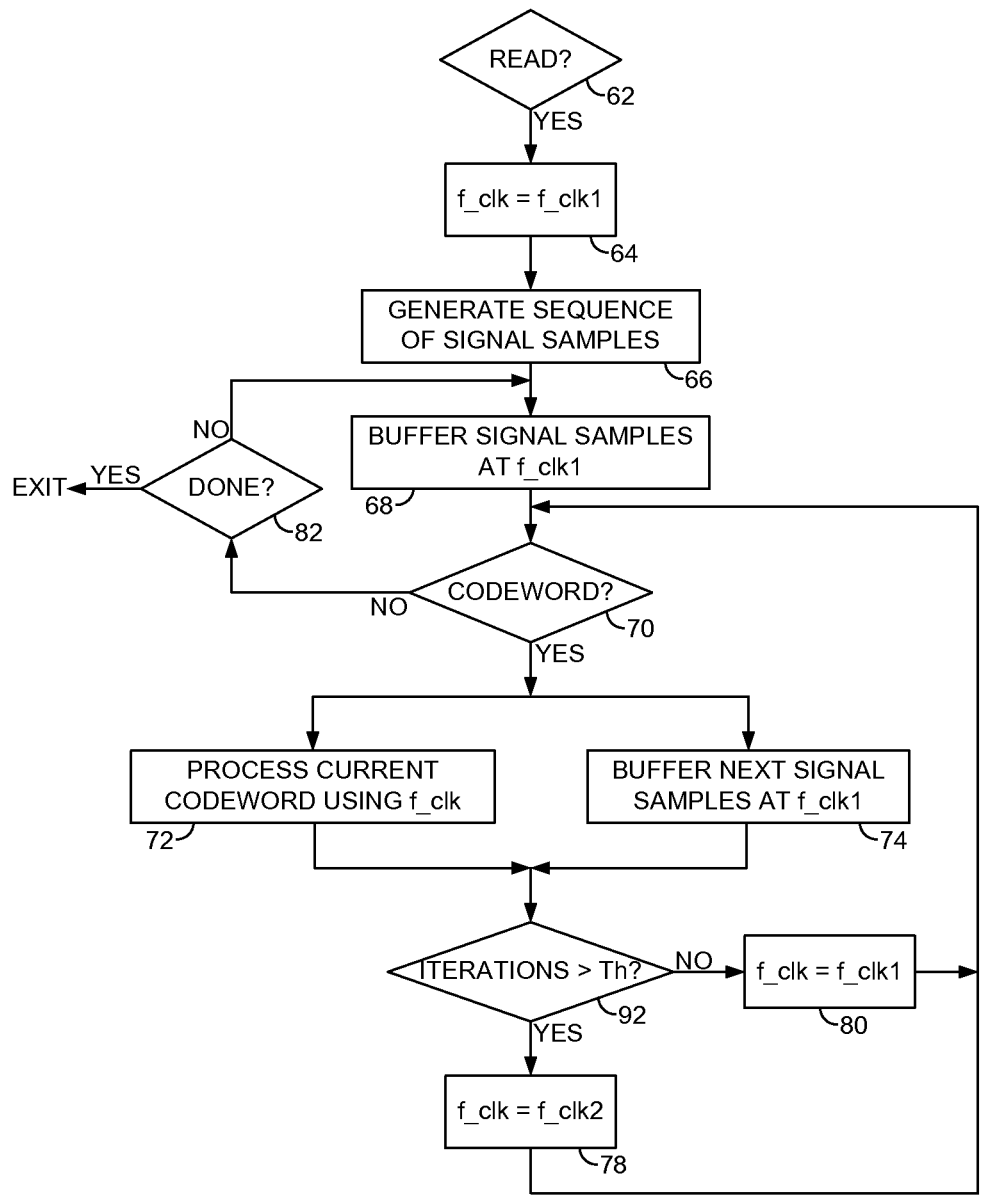
FIG. 7A is a flow diagram according to an embodiment wherein the bottleneck condition is detected when a number of iterations of an iterative detector exceeds a threshold.

FIG. 7A shows a flow diagram according to an embodiment wherein the processing time of an iterative detector (e.g., an LDPC detector) exceeds the processing time when the number of iterations needed to decode a codeword exceeds a threshold (block 92). In one embodiment, the iterative detector executes multiple iterations while updating log-likelihood ratios until the codeword is successfully decoded (or declared unrecoverable). When an iterative detector attempts to decode a codeword having low quality signal samples, the number of iterations needed to decode the codeword increases. In the embodiment of FIG. 7A, if the number of iterations needed to decode a current codeword exceeds the threshold (block 92), it may be assumed that a number of the following codewords may also be of low quality and therefore switching the iterative detector clock f_clk to the second, faster clock f_clk2 helps ensure the iterative detector maintains sufficient throughput while working through a marginal area of the storage medium.

Figure 7B:
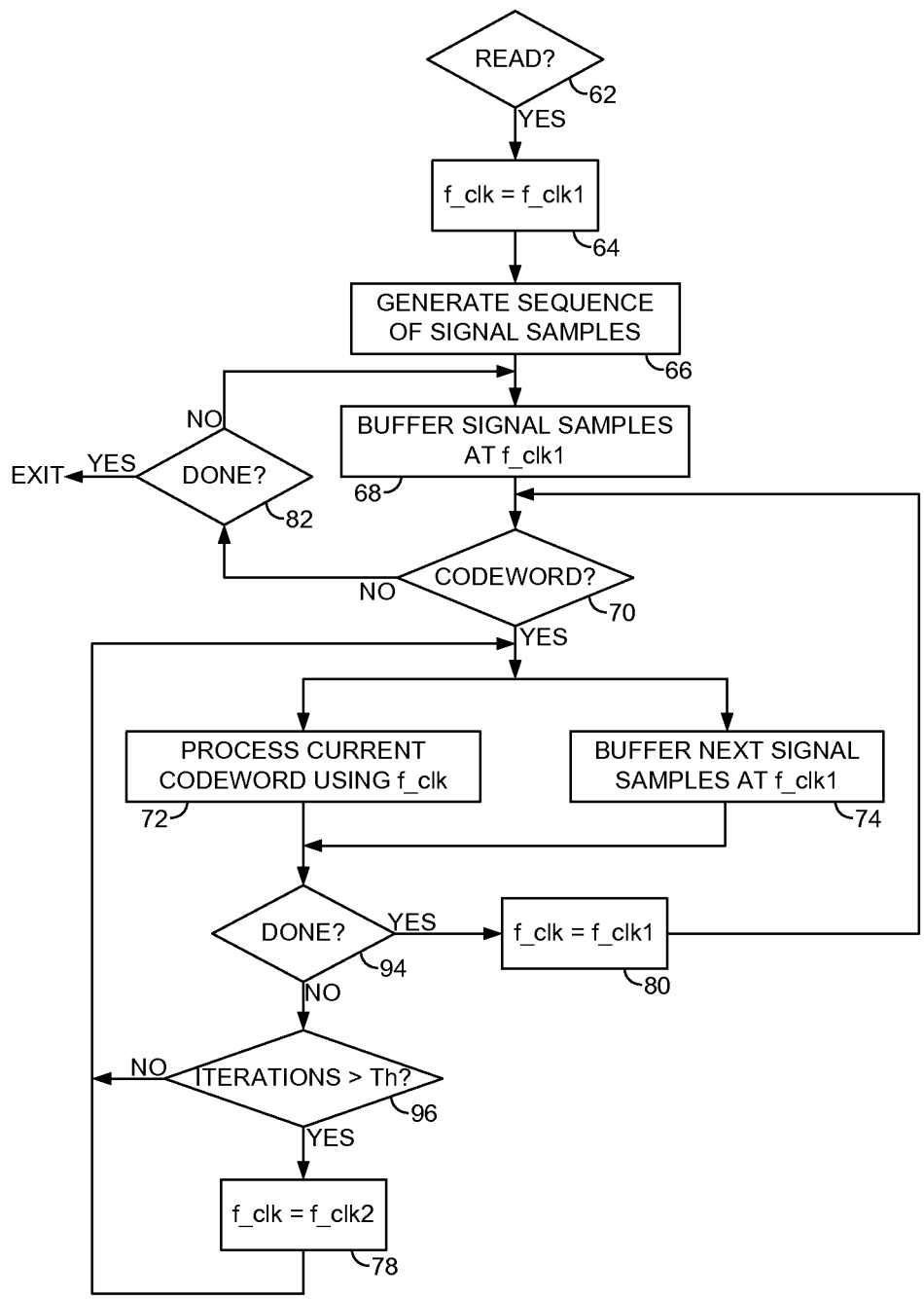
FIG. 7B is a flow diagram according to an embodiment wherein the control circuitry switches to the second, higher frequency to process the buffered signal samples when the processing time of a current codeword exceeds a threshold so that the current codeword is decoded faster.

FIG. 7B shows a flow diagram according to an embodiment similar to the flow diagram of FIG. 7A except that the processing time of the sequence detector is evaluated while processing the current codeword rather than after processing the current codeword. At a predetermined interval (e.g., after each iteration of an iterative detector), a check is made to determine whether the current codeword has been decoded (block 94). If not finished decoding the current codeword, the processing time (e.g., total number of iterations) is evaluated. If the processing time of the current codeword exceeds a threshold (block 96), the sequence detector clock f_clk is switched to the second, faster clock f_clk2 (block 78) in order to speed up the processing of the current codeword. When finished decoding the current codeword (block 94), the sequence detector clock f_clk is reset to the first, slower clock f_clk1 (block 80).

In some embodiments, a number of the bottleneck conditions described above may be evaluated and used to switch the sequence detector clock f_clk between the first clock f_clk1 and the second clock f_clk2. For example, a weighted average may be applied to both the processing time and the amount of free space available in the buffer 52 to derive a threshold criteria used to switch the clocking speed of the sequence detector as desired. In yet other embodiments, the threshold and/or threshold criteria for switching the clock speed may be modified based on an operating mode of the data storage device. For example, the host may configure the data storage device into a high performance high power mode to achieve maximum throughput (e.g., for desktop computing), or into a low performance low power mode that may sacrifice throughput performance to achieve lower power consumption (e.g., for mobile computing).

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a disk controller, or certain operations described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein.

What is claimed is:

1. A data storage device comprising:
a non-volatile memory (NVM); and
control circuitry operable to:
   during a read operation, generate a sequence of signal samples representing codewords stored in the NVM;
   buffer the signal samples to generate buffered signal samples;
   process the buffered signal samples at a first frequency to detect a data sequence;
   detect a bottleneck condition associated with processing the buffered signal samples at the first frequency; and when the bottleneck condition is detected, process the buffered signal samples at a second frequency higher than the first frequency to detect the data sequence.

2. The data storage device as recited in claim 1, wherein the control circuitry is operable to generate the sequence of signal samples at the first frequency.

3. The data storage device as recited in claim 2, wherein the control circuitry is further operable to buffer the signal samples in a buffer at the first frequency.

4. The data storage device as recited in claim 3, wherein the control circuitry is operable to buffer the signal samples of a first codeword in the buffer at the first frequency and concurrently process the buffered signal samples of a second codeword at the second frequency to detect the data sequence.

5. The data storage device as recited in claim 1, wherein the control circuitry is operable to:
transfer the buffered signal samples from the buffer to a sequence detector at the first frequency; and
when the bottleneck condition is detected, transfer the buffered signal samples from the buffer to the sequence detector at the second frequency.

6. The data storage device as recited in claim 1, wherein the control circuitry is operable to detect the bottleneck condition when the buffered signal samples exceed a threshold.

7. The data storage device as recited in claim 1, wherein the control circuitry is operable to detect the bottleneck condition when a number of codewords represented by the buffered signal samples exceeds a threshold.

8. The data storage device as recited in claim 1, wherein the control circuitry is operable to detect the bottleneck condition when a time to process a plurality of the buffered signal samples representing one of the codewords exceeds a threshold.

9. The data storage device as recited in claim 8, wherein the control circuitry is operable to:
process the plurality of the buffered signal samples using an iterative sequence detector over a number of iterations; and
detect the bottleneck condition when the number of iterations exceeds a threshold.

10. The data storage device as recited in claim 1, wherein the NVM comprises a non-volatile semiconductor memory.

11. The data storage device as recited in claim 1, wherein the NVM comprises a disk of a disk drive.

12. A method of operating a data storage device comprising a non-volatile memory (NVM), the method comprising:
during a read operation, generating a sequence of signal samples representing codewords stored in the NVM;
buffering the signal samples to generate buffered signal samples;
processing the buffered signal samples at a first frequency to detect a data sequence;
detecting a bottleneck condition associated with processing the buffered signal samples at the first frequency; and
when the bottleneck condition is detected, processing the buffered signal samples at a second frequency higher than the first frequency to detect the data sequence.

13. The method as recited in claim 12, further comprising generating the sequence of signal samples at the first frequency.

14. The method as recited in claim 13, further comprising buffering the signal samples in a buffer at the first frequency.

15. The method as recited in claim 14, further comprising buffering the signal samples of a first codeword in the buffer at the first frequency and concurrently processing the buffered signal samples of a second codeword at the second frequency to detect the data sequence.

16. The method as recited in claim 12, further comprising:
transferring the buffered signal samples from the buffer to a sequence detector at the first frequency; and
when the bottleneck condition is detected, transferring the buffered signal samples from the buffer to the sequence detector at the second frequency.

17. The method as recited in claim 12, further comprising detecting the bottleneck condition when the buffered signal samples exceed a threshold.

18. The method as recited in claim 12, further comprising detecting the bottleneck condition when a number of codewords represented by the buffered signal samples exceeds a threshold.

19. The method as recited in claim 12, further comprising detecting the bottleneck condition when a time to process a plurality of the buffered signal samples representing one of the codewords exceeds a threshold.

20. The method as recited in claim 19, further comprising:
processing the plurality of the buffered signal samples using an iterative sequence detector over a number of iterations; and
detecting the bottleneck condition when the number of iterations exceeds a threshold.

21. The method as recited in claim 12, wherein the NVM comprises a non-volatile semiconductor memory.

22. The method as recited in claim 12, wherein the NVM comprises a disk of a disk drive.

* * * * *